(12) United States Patent
Somekh

(10) Patent No.: US 6,291,334 B1
(45) Date of Patent: Sep. 18, 2001

(54) ETCH STOP LAYER FOR DUAL DAMASCENE PROCESS

(75) Inventor: Sasson Somekh, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/995,029

(22) Filed: Dec. 19, 1997

(51) Int. Cl.$^7$ ................................................. H01L 21/708
(52) U.S. Cl. .................... 438/620; 438/597; 438/598; 438/618; 438/689; 438/735; 438/736; 438/763; 438/778
(58) Field of Search ............................ 428/408; 257/77; 438/597, 598, 618, 620, 689, 735, 736, 763, 778

(56) References Cited

U.S. PATENT DOCUMENTS

| | | | |
|---|---|---|---|
| 4,789,648 | * 12/1988 | Chow et al. | 437/225 |
| 5,087,959 | * 2/1992 | Omori et al. | 357/54 |
| 5,246,884 | * 9/1993 | Jaso et al. | 437/225 |
| 5,559,367 | * 9/1996 | Cohen et al. | 257/77 |
| 5,635,423 | * 6/1997 | Huang et al. | 437/195 |
| 5,679,267 | * 10/1997 | Belcher et al. | 216/12 |
| 5,744,865 | * 4/1998 | Jeng et al. | 257/750 |
| 5,930,669 | * 7/1999 | Uzoh | 438/627 |
| 6,030,904 | * 2/2000 | Grill et al. | 438/781 |
| 6,057,227 | * 5/2000 | Harvey | 438/626 |
| 6,127,263 | * 10/2000 | Parikh | 438/637 |

FOREIGN PATENT DOCUMENTS

| | | |
|---|---|---|
| 0 224 013 A2 | 6/1987 | (EP) . |
| 0 696 819 A1 | 2/1996 | (EP) . |
| 0 768 388 A2 | 4/1997 | (EP) . |

OTHER PUBLICATIONS

U. S. application No. 08/778,205, Chen et al., filed Dec. 30, 1996.
U. S. application No. 08/914,521, Chen et al., filed Aug. 19, 1997.

(List continued on next page.)

Primary Examiner—Archene Turner
(74) Attorney, Agent, or Firm—Thomason, Moser & Patterson

(57) ABSTRACT

The present invention provides a carbon based etch stop, such as a diamond like amorphous carbon, having a low dielectric constant and a method of forming a dual damascene structure. The low k etch stop is preferably deposited between two dielectric layers and patterned to define the underlying interlevel contacts/vias. The second or upper dielectric layer is formed over the etch stop and patterned to define the intralevel interconnects. The entire dual damascene structure is then etched in a single selective etch process which first etches the patterned interconnects, then etches the contact/vias past the patterned etch stop. The etch stop has a low dielectric constant relative to a conventional SiN etch stop, which minimizes the capacitive coupling between adjacent interconnect lines. The dual damascene structure is then filled with a suitable conductive material such as aluminum or copper and planarized using chemical mechanical polishing.

11 Claims, 4 Drawing Sheets

OTHER PUBLICATIONS

Tue Nguyen, Bruce D. Ulrich, Lynn R. Allen and David R. Evans, "A Novel Damascene Process for One Mask Via/Interconnect Formation," 1996 Symposium on VLSI Technology Digest of Technical Papers, pp. 118–119.

European PCT International Search Report Dated Mar. 3, 1999.

IBM® Technical Disclosure Bulletin, "Damascene: Optimized Etch Stop Structure and Method," vol. 36, No. 11 Nov. 1993, p. 649.

S. Lakshminarayanan, J. Steigerwald, D. T. Price, M. Bourgeois, T. P. Chow, "Contact and Via Structures with Copper Interconnects Fabricated Using Dual Damascene Technology," Electron Device Letters, vol. 15, No. 8 Aug. 8, 1994, pp. 307–309.

Rajiv V. Joshi, "A New Damascene Structure for Submicrometer Interconnect Wiring," Electron Device Letters, vol. 14, No. 3, Mar. 1993, pp. 129–132.

Howard Landis, Peter Burke, William Cote, William Hill, Cheryl Hoffman, Carter Kaanta, Charles Koburger, Walter Lange, Michael Leach and Stephen Luce, "Integration of chemical—mechanical polishing into CMOS integrated circuit manufacturing," Thin Solid Films, 220 (1992), pp. 1–7.

Carter W. Kaanta, Susuan G. Bombardier, William J. Cote, William R. Hill, Gloria Kerszykowski, Howard S. Landis, Dan J. Poindexter, Curtis W. Pollard, Gilbert H. Ross, James G. Ryan, Stuart Wolff, John E. Cronin, "Dual Damascene: A Ulsi Wiring Technology," Jun. 11–12, 1991 VMIC Conference, pp. 144–152.

T. Licata, M. Okazaki, M. Ronay, W. Landers, T. Ohiwa, H. Poetzlberger, H. Aochi, D. Dobuzinsky, R. Filippi, D. Restaino, D. Knorr, J. Ryan, "Dual Damascene Al Wiring For 256M DRAM," Jun. 27–29, 1995 VMIC Conference, pp. 596–602.

CRC Handbook of Chemistry and Physics, $79^{th}$ Edition (1998–1999), pp. 12–19 and 12–55. (No month).

Grill et al., "Diamondlike Carbon Films by RF Plasma–Assisted Chemical Vapor Deposition From Acetylene", IBM Journal of Research and Development, 34(6), 1990, p. 849–857. (No month).

PCT International Preliminary Examination Report dated Feb. 15, 2000.

* cited by examiner

ETCH STOP LAYER FOR DUAL DAMASCENE PROCESS

BACKGROUND OF THE INVENTION

1. Field of the Invention

The present invention relates generally to the fabrication of integrated circuits on substrates. More particularly, the invention relates to a new etch stop layer and a process for forming a dual damascene structure characterized by a low capacitance between interconnect lines.

2. Background of the Invention

Consistent and fairly predictable improvement in integrated circuit design and fabrication has been observed in the last decade. One key to successful improvements is the multilevel interconnect technology which provides the conductive paths between the devices of an integrated circuit (IC) device. The shrinking dimensions of horizontal interconnects (typically referred to as lines) and vertical interconnects (typically referred to as contacts or vias: contacts extend to a device on the underlying substrate while vias extend to an underlying metal layer such as M1, M2, etc.) in very large scale integration (VLSI) and ultra large scale integration (ULSI) technology has increased the importance of reducing capacitive coupling between interconnect lines in particular. In order to further improve the speed of semiconductor devices on integrated circuits, it has become necessary to use conductive materials having low resistivity and low k (dielectric constant <4.0) insulators to reduce the capacitive coupling between adjacent metal lines. For example, copper is now being considered as an interconnect material in place of aluminum because copper has a lower resistivity and higher current carrying capacity. Also, dielectric materials having a lower dielectric constant than that of silicon dioxide (dielectric constant ~4.0) are being seriously considered for use in production devices. One example of these dielectric materials is fluorine-doped silicon dioxide also known as fluorine-doped silicon glass (FSG) (dielectric constant ~3.5–3.7).

However, these materials present new problems for IC manufacturing processes. For example, because copper is difficult to etch in a precise pattern, traditional deposition/etch processes for forming interconnects has become unworkable, and accordingly, a process referred to as a dual damascene is being used to form copper interconnects. In a dual damascene process, the dielectric layer is etched to define both the contacts/vias and the interconnect lines. Metal is then inlaid into the defined pattern and any excess metal is removed from the top of the structure in a planarization process, such as chemical mechanical polishing (CMP).

FIGS. 1a through 1c illustrate one method used in the fabrication of a dual damascene structure using a single (thick) dielectric layer 10 formed on a substrate 12. The dielectric layer 10 is patterned and etched using a timed etch process to define an interconnect line 20 as shown in FIG. 1a. The vertical interconnects 16 (i.e., contacts/vias), are then patterned in the bottom of the lines (FIG. 1b) and etched to expose an underlying conductive or semiconductive layer such as a substrate 12 (FIG. 1c). The etched structure having contacts/vias 16 and interconnects 20 is filled with a conductive material and the upper surface is planarized. However, the depth of the timed etch step is difficult to control and the patterning of the contacts/vias in the interconnect trenches is also a difficult process to perform.

FIGS. 2a and 2b illustrate another method used to fabricate a dual damascene structure. As shown in FIG. 2a, a single (thick) dielectric layer 10 is formed on a substrate 12 and the contacts/vias 16 are patterned and partially etched through the dielectric layer 10 using a timed etch process. The interconnect lines 20 are then patterned and a second timed etch is conducted to form the trenches for the interconnects as shown in FIG. 2b. During this second timed etch, the contacts/vias 16 are also etched to an additional depth sufficient for the contacts/vias to extend vertically to their intended depth as shown by the dashed lines. However, the timed etch steps again are difficult to control making this process less attractive for commercial production.

A third and more preferable method for fabricating a dual damascene structure uses a two-step dielectric deposition with an etch stop deposited therebetween as shown in FIG. 3. A first dielectric layer 10 is deposited on a substrate and then an etch stop 14 is deposited on the first dielectric layer. The etch stop is then patterned to define the openings of the contacts/vias 16. A second dielectric layer 18 is then deposited over the patterned etch stop and then patterned to define the interconnect lines 20. A single etch process is then performed to define the interconnects down to the etch stop and to etch the unprotected dielectric exposed by the patterned etch stop to define the contacts/vias.

Silicon nitride has been the etch stop material of choice. However, the silicon nitride disposed between the dielectric layers is within the fringing field between the interconnects. Silicon nitride has a relatively high dielectric constant (dielectric constant ~7) compared to the surrounding dielectric, and it has been discovered that the silicon nitride may significantly increase the capacitive coupling between interconnect lines, even when an otherwise low k dielectric material is used as the primary insulator. This may lead to cross talk and/or resistance-capacitance (RC) delay which degrades the overall performance of the device.

Therefore, there is a need for a process to form a dual damascene with decreased capacitive coupling between interconnects.

SUMMARY OF THE INVENTION

The present invention provides a process sequence and etch stop material which provides a reliable dual damascene structure while minimizing the contribution of the etch stop layer to the capacitive coupling between interconnect lines. In one embodiment, a low k dielectric film, such as an amorphous carbon (α-C) or amorphous fluorinated carbon (α-FC) film is used as the etch stop below an intermetal dielectric (IMD). Other low k materials such as parylene, $AF_4$, BCB, PAE, oxynitride and silicon carbide may also be used.

A preferred process sequence of the invention comprises depositing a first dielectric layer, such as a fluorinated silicate glass (FSG) layer, on a substrate, depositing a low k dielectric etch stop, such as an α-FC layer, on the first dielectric layer, patterning the etch stop to define the contacts/vias, depositing a second layer of a dielectric, such as FSG, patterning a resist layer on the second layer of dielectric to define one or more interconnects, and etching the interconnects and contacts/vias. The interconnects are etched down to the etch stop in the final etch step, and then the etching continues past the patterned etch stop to define the contacts/vias. Once the dual damascene structure has been formed, a barrier layer is preferably deposited conformably in the structure prior to filling the structure with copper to isolate the copper from other materials, such as silicon. The upper surface is then planarized using chemical mechanical polishing techniques.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

The present invention provides an improved dual damascene structure comprising a low k etch stop, preferably an amorphous, diamond-like carbon (α-C) material. Low k etch stop is defined herein as an etch stop having a dielectric constant equal to or lower than that of silicon nitride (dielectric constant ~7.0). A dual damascene structure fabricated in accordance with the invention is shown in FIG. 4h and the method of making the structure is sequentially depicted schematically in FIGS. 4a–4h, which are cross sectional views of a substrate having the steps of the invention formed thereon.

Figure 1A:
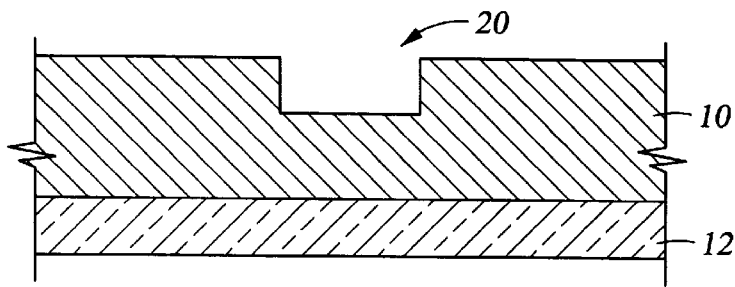
FIGS. 1a–1c are cross sectional views showing a prior art dual damascene process.
Figure 1B:
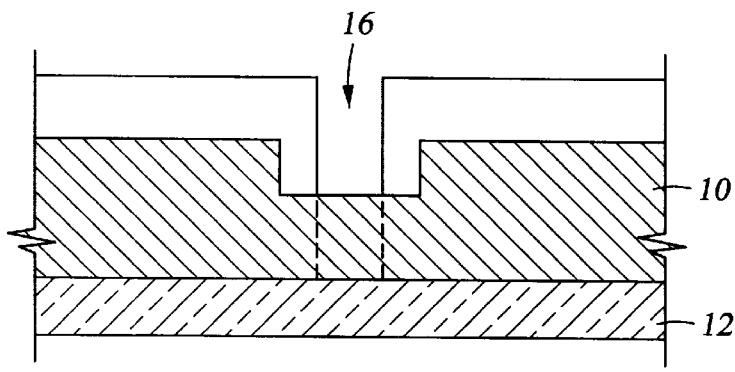
Figure 1C:
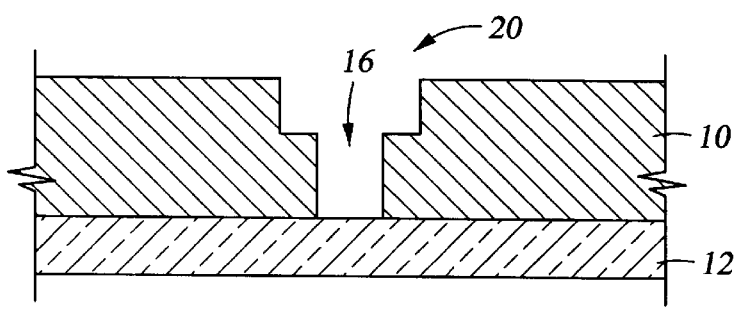
Figure 2A:
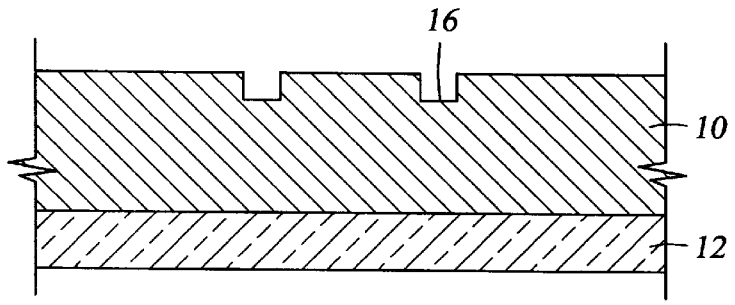
FIGS. 2a and 2b are cross sectional views showing a prior art dual damascene process.
Figure 2B:
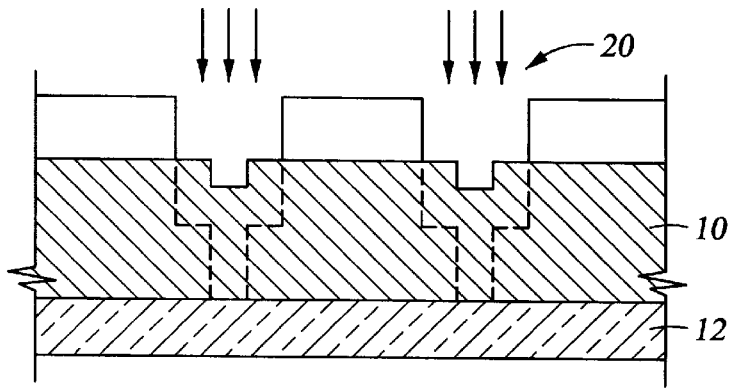
Figure 3:
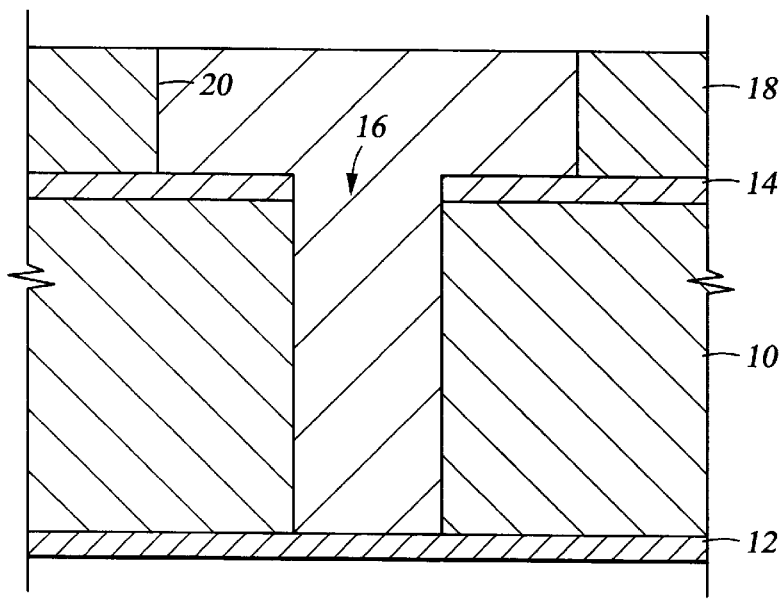
FIG. 3 is a cross sectional view showing a dual damascene structure formed on a substrate.
Figure 4A:
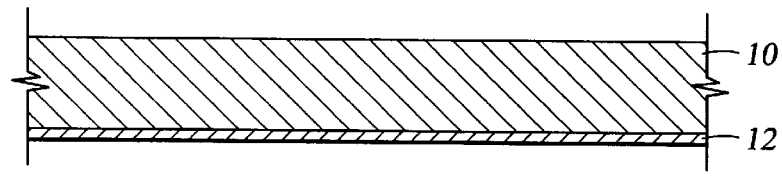
FIGS. 4a–4h are cross sectional views showing one embodiment of a deposition sequence of the present invention.
Figure 4B:
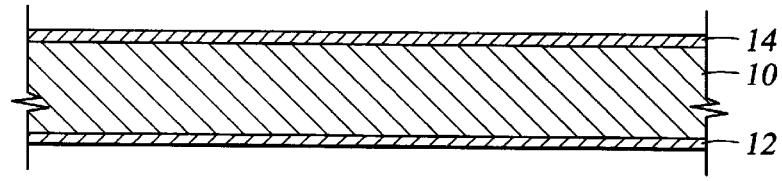
Figure 4C:
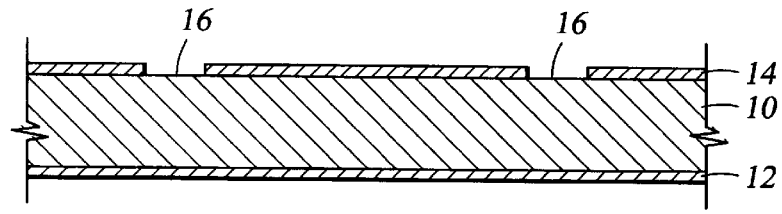
Figure 4D:
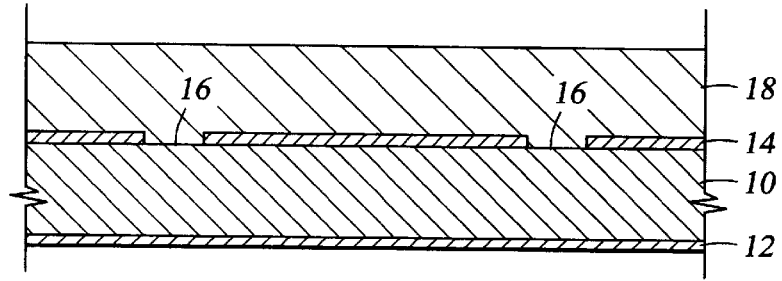
Figure 4E:
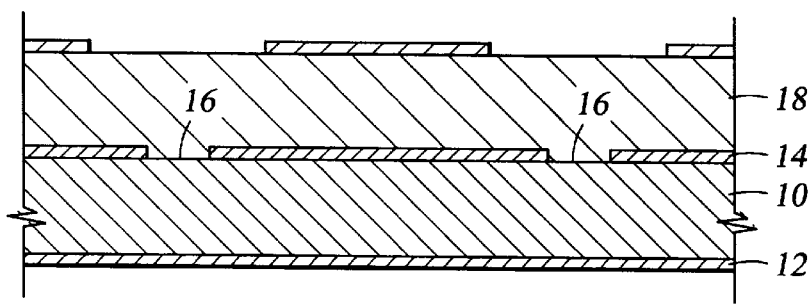
Figure 4F:
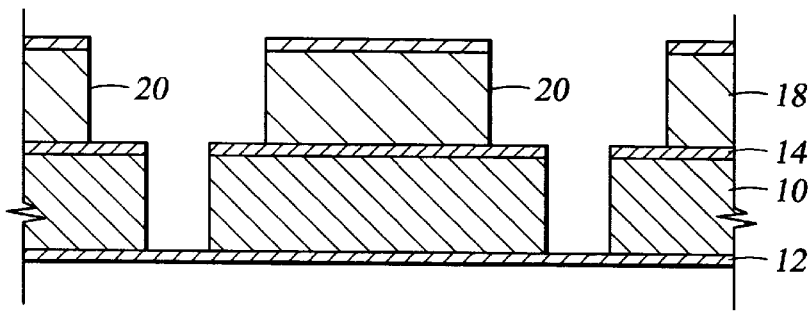

As shown in FIG. 4a, an initial first dielectric layer 10, such as FSG, silicon oxide, or the like, is deposited on the substrate 12 to a thickness of about 5,000 to about 10,000 Å, depending on the size of the structure to be fabricated. As shown in FIG. 4b, a low k etch stop 14, such as α-C, α-FC, parylene, $AF_4$, BCB, PAE, oxynitride or silicon carbide, is then deposited on the first dielectric layer to a thickness of about 200 to about 1000 Å. Low k etch stop 14 is then pattern etched to define the contact/via openings 16 and to expose first dielectric layer 10 in the areas where the contacts/vias are to be formed as shown in FIG. 4c. Preferably, low k etch stop 14 is pattern etched using conventional photolithography and etch processes using fluorine, carbon, and oxygen ions. After low k etch stop 14 has been etched to pattern the contacts/vias and the photoresist has been removed, a second dielectric layer 18 is deposited over etch stop 14 to a thickness of about 5,000 to about 10,000 Å as shown in FIG. 4d. Second dielectric layer 18 is then patterned to define interconnect lines 20, preferably using conventional photolithography processes with a photoresist layer 22 as shown in FIG. 4e. The interconnects and contacts/vias are then etched using reactive ion etching or other anisotropic etching techniques to define the metallization structure (i.e., the interconnect and contact/via) as shown in FIG. 4f. Any photoresist or other material used to pattern the etch stop 14 or the second dielectric layer 18 is removed using an oxygen strip or other suitable process.

Figure 4G:
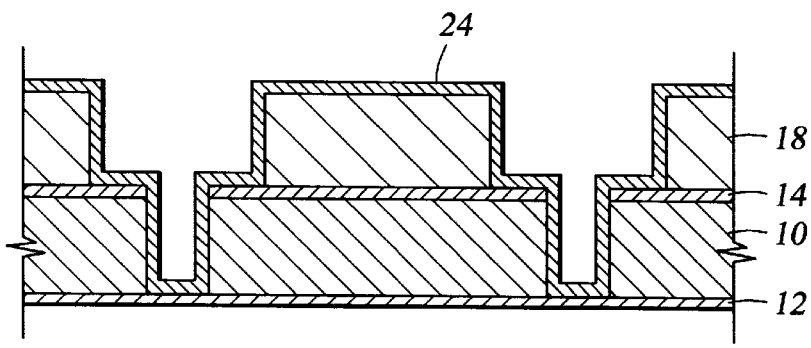
Figure 4H:
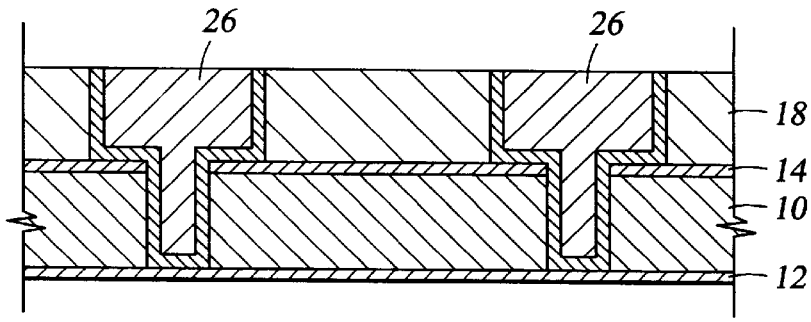

The metallization structure is then formed with a conductive material such as aluminum, copper, tungsten or combinations thereof. Presently, the trend is to use copper to form the smaller features due to the low resistivity of copper (1.7 $\mu\Omega$-cm compared to 3.1 $\mu\Omega$-cm for aluminum). Preferably, as shown in FIG. 4g, a barrier layer 24 such as tantalum, tantalum nitride, or other suitable barrier is first deposited conformally in the metallization pattern to prevent copper migration into the surrounding silicon and/or dielectric material. Thereafter, copper is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 4h.

Figure 5:
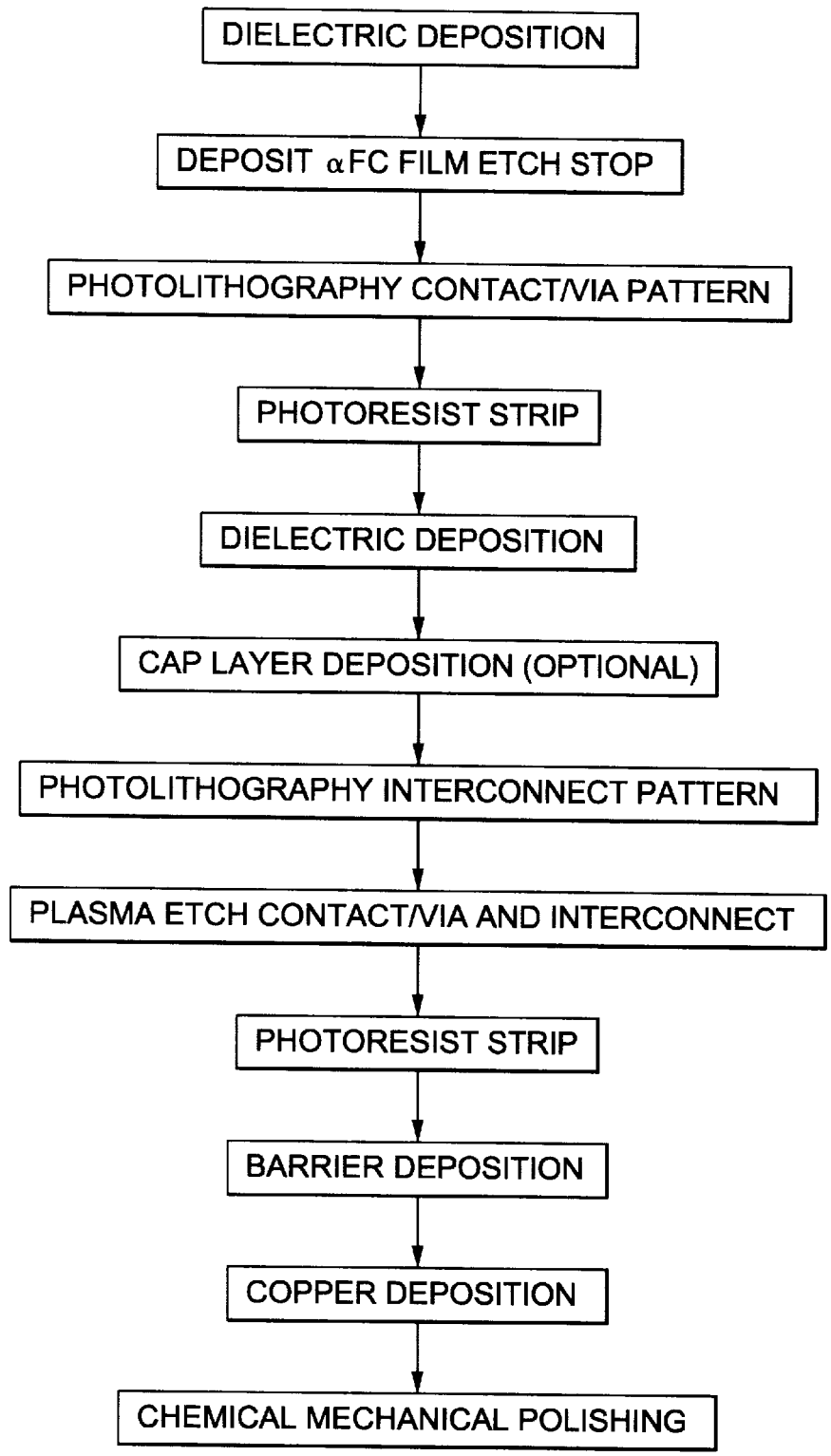
FIG. 5 is a process sequence for deposition of the dual damascene structure of FIG. 4h.

One embodiment of the invention contemplates the use of FSG as the intermetal dielectric, α-FC (dielectric constant ~2.8) as the etch stop and copper as the metal to complete the dual damascene structure. This process will now be described in detail below. The process steps for the following embodiment are shown in FIG. 5.

A substrate is introduced into a DxZ® chamber available from Applied Materials, Inc., Santa Clara, Calif. A first blanket FSG layer of about 5000 Å is deposited on the substrate by flowing TEOS, $O_2$, and $C_2F_6$ or other gases over the substrate surface.

An oxide barrier layer may be deposited on the FSG layer to inhibit migration of species between the FSG layer and the subsequent α-FC layer.

Next, the substrate is moved to an Ultima™ HDP-CVD chamber, also available from Applied Materials, Inc. of Santa Clara, Calif., where a 500 Å α-FC etch stop layer is formed on the first FSG layer. The α-FC etch stop layer is deposited by flowing octafluorocyclobutane ($C_4F_8$) and methane ($CH_4$) into the chamber at a rate of between about 20 sccm and about 200 sccm, preferably about 50 sccm. Argon, or other inert gas, is flown into the chamber at a rate of from about 20 sccm to about 100 sccm. A source power of 1000W and a bias power of 1000W are applied to the source coil and the substrate support member, respectively, to strike and maintain a high density plasma in the processing chamber. The chamber pressure during deposition is preferably less than 10 mTorr. While the above described process is preferred, other processes and precursor gases such as $CH_4$, $C_2H_4$, $C_2H_6$, $C_2H_2$, $C_6H_6$, $CF_4$, $C_2F_6$, $C_3F_8$, $CHF_3$, and $C_6F_6$ may also be used.

Next, a photoresist layer is formed over the α-FC etch stop layer and exposed by conventional photolithography methods to define the contact/via openings. The substrate is then moved to a dielectric etch chamber such as the IPS Chamber available from Applied Materials, Inc., of Santa Clara, Calif. The α-FC etch stop layer is preferably etched anisotropically with a high density plasma of trifluoromethane ($CHF_3$), $O_2$, and Ar to define the contact/via openings through the α-FC etch stop layer. Etching of the α-FC etch stop layer is preferably stopped prior to substantial etching of the underlying FSG layer to avoid overetching. Endpoint detection between the α-FC film and the FSG layer is conveniently done by optical detection of the etch by-product gases. The remaining photoresist layer is then stripped using an $O_2$ plasma.

The substrate is then moved back into the DxZ® chamber where a second 5,000 Å FSG layer is formed on the patterned α-FC etch stop layer. A second photoresist layer is then deposited on the second FSG layer and exposed by conventional photolithography methods to define the interconnect openings through the photoresist. The substrate is then returned to the IPS chamber and the entire dual damascene structure is etched in a single step by exposing the substrate to a carbon rich, oxygen free, fluorine-carbon etching environment. Preferably, the FSG layers are etched anisotropically with a plasma of $C_3F_8$ or $C_3F_6$ and Ar so that the interconnects and contacts/vias are formed with relatively straight sidewalls and no under cuts. Hydrogen can be added in small amounts to passivate the sidewalls. Once the interconnects are etched down to the patterned α-FC film, etching is substantially confined to the patterned contacts/vias. Endpoint detection after etching through both FSG layers is conveniently done by optical detection of the etch by-product gases. After etching of the interconnect is complete, the remaining resist layer is stripped using an $O_2$ plasma.

Preferably, a barrier layer of tantalum, tantalum nitride, combinations thereof, or other suitable barrier layer is formed over the patterned dual damascene structure and then the structure is filled with copper. One method which can be used to fill the structure with copper provides filling the contacts/vias with copper using CVD techniques and then filling the remaining volume of the structure using PVD techniques. However, any suitably Filling process such as CVD, PVD (including high density plasma PVD), electroplating or combinations thereof may be used. The metal layer is then planarized by chemical mechanical polishing or other planarizing process prior to deposition of additional layers.

As shown in FIG. 4h, a copper dual damascene structure is formed having a low k etch stop 14 disposed between the interconnects 26. The low k properties of the etch stop 14 prevent cross talk and increased RC delay between interconnects from adversely affecting the speed of the device.

Alternatives to α-C and α-FC etch stops include other carbon based materials. In particular, there are a number of carbon based materials that may be suitable etch stops for oxide intermetal dielectrics. Such materials which also have dielectric constants lower than SiN would reduce the capacitive coupling between interconnect lines. Such alternative carbon based films include parylene and related materials, such as parylene-N and $AF_4$, BCB spin-on, PAE, oxynitride and silicon carbide.

While the foregoing is directed to the preferred embodiment of the present invention, other and further embodiments of the invention may be devised without departing from the basic scope thereof, and the scope thereof is determined by the claims which follow.

What is claimed is:

1. A method of forming a dual damascene structure, comprising:

depositing a first dielectric film on a substrate;

depositing a low k etch stop on the first dielectric film;

patterning the low k etch stop to define a vertical interconnect opening and expose the first dielectric film;

depositing a second dielectric film on the low k etch stop and the exposed first dielectric film;

pattern etching the second dielectric film to define a horizontal interconnect and continuing to etch the exposed first dielectric film to define the vertical interconnect; and wherein at least one of the first and second dielectric layers are comprised of fluorine doped silicon glass and the low k etch stop is comprised of α-FC.

2. The method of claim 1 wherein etching the horizontal and vertical interconnects is a single step etch process.

3. The method of claim 1 wherein the α-FC etch stop is deposited from gases selected from the group comprising $CH_4$, $C_2H_4$, $C_2H_6$, $C_2H_2$, $C_6H_6$, $CF_4$, $C_2F_6$, $C_3F_8$, $C_4F_8$, $CHF_3$, and combinations thereof.

4. The method of claim 1 wherein the α-FC is deposited from gases comprising $C_4F_8$ and $CH_4$.

5. A method of forming a dual damascene structure, comprising:

depositing a first dielectric film on a substrate;

depositing a low k etch stop on the first dielectric film;

patterning the low k etch stop to define a vertical interconnect opening and expose the first dielectric film;

depositing a second dielectric film on the low k etch stop and the exposed first dielectric film; and pattern etching the second dielectric film to define a horizontal interconnect and continuing to etch the exposed first dielectric film to define the vertical interconnect;

wherein the low k etch stop is comprised of α-FC deposited from gases comprising $C_4F_8$ and $CH_4$.

6. The method of claim 5 wherein at least one the first and second dielectric layers are comprised of fluorine doped silicon glass.

7. The method of claim 5 wherein etching the horizontal and vertical interconnects is a single step etch process.

8. A method of forming a dual damascene structure, comprising:

depositing a first dielectric film on a substrate;

depositing a low k etch stop on the first dielectric film;

depositing a first photoresist layer on the low k dielectric etch stop;

patterning the first photoresist layer to define one or more vertical interconnect openings;

pattern etching the low k dielectric etch stop to define the one or more vertical interconnect openings and expose the first dielectric film;

stripping the first photoresist layer with an oxygen plasma;

depositing a second dielectric film on the low k dielectric etch stop and the exposed first dielectric film;

depositing a second photoresist layer on the second dielectric film;

patterning the second photoresist layer to define one or more horizontal interconnects;

pattern etching the second dielectric film to define the one or more horizontal interconnects and continuing to etch the first dielectric film to define the one or more vertical interconnects; and depositing an oxide barrier layer before and after deposition of the low k etch stop;

wherein at least one of the first and the second dielectric layers are comprised of fluorine doped silicon lass and the low k etch stop is comprised of α-FC.

9. The method of claim 8 wherein etching the horizontal and vertical interconnects is a single step etch process.

10. The method of claim 8 wherein the α-FC low k etch stop is deposited from gases selected from the group comprising $CH_4$, $C_2H_4$, $C_2H_6$, $C_2H_2$, $C_6H_6$, $CF_4$, $C_2F_6$, $C_3F_8$, $C_4F_8$, $CHF_3$, and combinations thereof.

11. A method of forming a dual damascene structure, comprising:

depositing a first dielectric film on a substrate;

depositing a low k etch stop on the first dielectric film;

depositing a first photoresist layer on the low k dielectric etch stop;

patterning the first photoresist layer to define one or more vertical interconnect openings;

pattern etching the low k dielectric etch stop to define the one or more vertical interconnect openings and expose the first dielectric film;

stripping the first photoresist layer with an oxygen plasma;

depositing a second dielectric film on the low k dielectric etch stop and the exposed first dielectric film;

depositing a second photoresist layer on the second dielectric film;

patterning the second photoresist layer to define one or more horizontal interconnects; and pattern etching the second dielectric film to define the one or more horizontal interconnects and continuing to etch the first dielectric film to define the one or more vertical interconnects;

wherein the low k dielectric etch stop is α-FC deposited from gases comprising $C_4F_8$ and $CH_4$.

* * * * *

UNITED STATES PATENT AND TRADEMARK OFFICE
CERTIFICATE OF CORRECTION

PATENT NO. : 6,291,334 B1
DATED : September 18, 2001
INVENTOR(S) : Somekh

It is certified that error appears in the above-identified patent and that said Letters Patent is hereby corrected as shown below:

Title page,
In the title, please insert "AN" before -- ETCH --.
OTHER PUBLICATIONS, please replace "Aug. 8, 1994," with -- Aug. 1994, --; and please replace "pp. 12-19" with -- pp. 12-49 --.

Column 5,
Line 22, please replace "Filling" with -- filling --.

Column 6,
Line 20, please insert -- of -- after "one".
Line 53, please replace "lass" with -- glass --.

Signed and Sealed this

Eleventh Day of June, 2002

*Attest:*

*Attesting Officer*

JAMES E. ROGAN
*Director of the United States Patent and Trademark Office*